US006560258B1

(12) United States Patent
McQuilkin

(10) Patent No.: US 6,560,258 B1
(45) Date of Patent: May 6, 2003

(54) DIRECT-COUPLED LASER DIODE DRIVER STRUCTURES AND METHODS

(75) Inventor: Christopher McQuilkin, Salem, NH (US)

(73) Assignee: Analog Devices, Inc., Norwood, MA (US)

( * ) Notice: Subject to any disclaimer, the term of this patent is extended or adjusted under 35 U.S.C. 154(b) by 184 days.

(21) Appl. No.: 09/837,818

(22) Filed: Apr. 17, 2001

(51) Int. Cl.[7] .................................................. H01S 3/00
(52) U.S. Cl. ................. 372/38.02; 372/38.1; 372/38.01; 372/26
(58) Field of Search ................... 372/38.02, 31, 372/38, 109, 38.01, 26, 29, 25, 30

(56) References Cited

U.S. PATENT DOCUMENTS

| | | | |
|---|---|---|---|
| 4,558,465 A | * 12/1985 | Siegel et al. ................. 359/184 |
| 4,709,416 A | * 11/1987 | Patterson ..................... 359/187 |
| 4,718,118 A | * 1/1988 | Viola .......................... 359/180 |
| 4,808,858 A | * 2/1989 | Stoops ........................ 327/322 |
| 4,995,045 A | 2/1991 | Barley et al. ................. 372/38 |
| 5,268,916 A | 12/1993 | Slawson et al. ............... 372/38 |
| 5,402,433 A | 3/1995 | Stiscia .......................... 372/31 |
| 5,444,729 A | 8/1995 | Chung ......................... 372/38 |
| 5,646,560 A | * 7/1997 | Nguyen ....................... 327/109 |
| 5,708,673 A | * 1/1998 | Ikeuchi ..................... 372/29.01 |
| 5,802,089 A | * 9/1998 | Link ......................... 372/38.02 |
| 5,812,572 A | * 9/1998 | King et al. ............... 372/38.04 |
| 5,859,862 A | 1/1999 | Hikasa et al. .................. 372/38 |

* cited by examiner

Primary Examiner—Paul Ip
Assistant Examiner—Tuan Nguyen
(74) Attorney, Agent, or Firm—Koppel, Jacobs, Patrick & Heybl

(57) ABSTRACT

Direct-coupled laser diode drivers are provided which eliminate the need for conventional coupling elements (e.g., capacitors and inductors) that typically introduce timing inacurracies and add complexity, size and cost to conventional drivers. The drivers are structured to reduce power dissipation and maintain sufficient transistor headroom to enhance response time and dynamic range. An exemplary driver responds to data pulses that are defined by first and second pulse levels and includes a current source that generates an $i_{mod}/n$ current, a current mirror connected to receive the $i_{mod}/n$ current and, in response, drive a modulation current $i_{mod}$ through the laser diode and a differential pair of transistors that steers the $i_{mod}/n$ current away from the modulation current mirror in response to the first pulse levels so that the modulation current mirror drives $i_{mod}$ current pulses through the laser diode during the second pulse levels with no need for coupling elements. The drivers are stabilized with feedback light from the laser diode.

28 Claims, 5 Drawing Sheets

DIRECT-COUPLED LASER DIODE DRIVER STRUCTURES AND METHODS

BACKGROUND OF THE INVENTION

1. Field of the Invention

The present invention relates generally to laser diodes and, more particularly, to laser diode drivers.

2. Description of the Related Art

The modern field of lightwave communications has greatly enhanced information transmission. Optical fibers are the preferred transmission path of this dynamic field and semiconductor laser diodes are the preferred generators of coherent light which is transmitted through this transmission path. In an exemplary process of this field, communication data is converted to current pulses and, in response to the current pulses, laser diodes emit coherent light pulses which are guided over long distances through low-loss optical fibers.

A laser diode typically has a threshold current $i_{thld}$ (e.g., 20–30 milliamps) which is the minimum current at which the diode lases. After lasing is initiated, the laser diode's light emission becomes much more efficient and is substantially proportional to additional diode current. Accordingly, laser diode current pulses are typically formed with a constant bias current $i_{bias}$ which is just above the threshold current $i_{thld}$ and an added modulation current $i_{mod}$ that is responsive to a data signal. Because both current levels exceed the threshold current $i_{thld}$, they cause a laser diode to generate coherent light with power levels that respectively correspond to the bias current $i_{bias}$ and to the sum of the bias current $i_{bias}$ and the modulation current $i_{mod}$.

The graph 20 of FIG. 1 illustrates an exemplary plot 22 of a laser diode's optical power as a function of diode current. Optical power is low and substantially constant until the diode current reaches the threshold current $i_{thld}$. Above the threshold current $i_{thld}$, the diode is in its lasing mode and output power is substantially proportional to the diode current.

FIG. 1 illustrates current pulses 24 whose lower and upper current levels are respectively the bias current $i_{bias}$ and the sum of the bias current $i_{bias}$ and the modulation current $i_{mod}$. The substantially-linear portion of the plot 22 shows that a laser diode will respond to the current pulses 24 by generating light pulses 26 which have a lower power $P_0$ and an upper power $P_1$ that respectively correspond to the lower and upper current levels of the current pulses 24.

Various laser diode drivers have been proposed for converting data pulses into laser diode current pulses. These conventional drivers typically provide a constant bias current $i_{bias}$ which is driven through the laser diode and a differential pair of transistors which respond to data pulses by steering a current pulse of magnitude $i_{mod}$ through the laser diode. The modulation current $i_{mod}$ is generally generated by a current mirror which is coupled as a tail current to the emitters of the differential pair. The current pulses are typically coupled through a capacitor to the laser diode and an inductor is coupled in parallel across the laser diode and the capacitor.

These conventional laser drivers are preferably realized as monolithic integrated circuit chips to reduce their size and cost. Their structure, however, degrades the possible advantages of such chips. For example, the bias voltage $V_{CC}$ of the chips is preferably limited to 5 volts which does not provide sufficient headroom for collectors of the differential pair. In order to resolve this problem, the differential pair is generally coupled to the laser diode with the capacitor/inductor network described above but as a consequence, settling effects in the capacitor/inductor network generate timing inaccuracies when the laser diode is driven at different duty cycles. Increasing the values of the inductor and capacitor reduces these inaccuracies but this requires that these elements be located adjacent the chips which increases driver complexity, size and cost.

SUMMARY OF THE INVENTION

The present invention is directed to laser diode drivers which are directly coupled so as to eliminate coupling elements that introduce timing inaccuracies and add complexity, size and cost. In addition, these drivers reduce power dissipation and maintain sufficient transistor headroom to enhance response time and dynamic range.

A laser diode driver of the invention includes a data switch that responds to data pulses by driving current pulses through a laser diode to generate corresponding light pulses wherein the data pulses are defined by first and second pulse levels. A data switch embodiment includes:

a) a bias current mirror that drives a bias current $i_{bias}$ through the laser diode in response to an input current;

b) a modulation current source that generates an $i_{mod}/n$ current, c) a modulation current mirror connected to receive the $i_{mod}/n$ current and, in response, drive a modulation current $i_{mod}$ through the laser diode, and d) a modulation differential pair of transistors that steers the $i_{mod}/n$ current away from the modulation current mirror in response to the first pulse levels.

Accordingly, the modulation current mirror drives $i_{mod}$ current pulses through the laser diode during the second pulse levels with no need for coupling elements.

The laser diode driver further includes a controller which receives a feedback light signal from the laser diode and, in response, provides the input current to the bias current mirror and a tail current to the modulation differential pair that are varied to stabilize the laser diode's light pulses.

The novel features of the invention are set forth with particularity in the appended claims. The invention will be best understood from the following description when read in conjunction with the accompanying drawings.

DETAILED DESCRIPTION OF THE PREFERRED EMBODIMENTS

Figure 2:
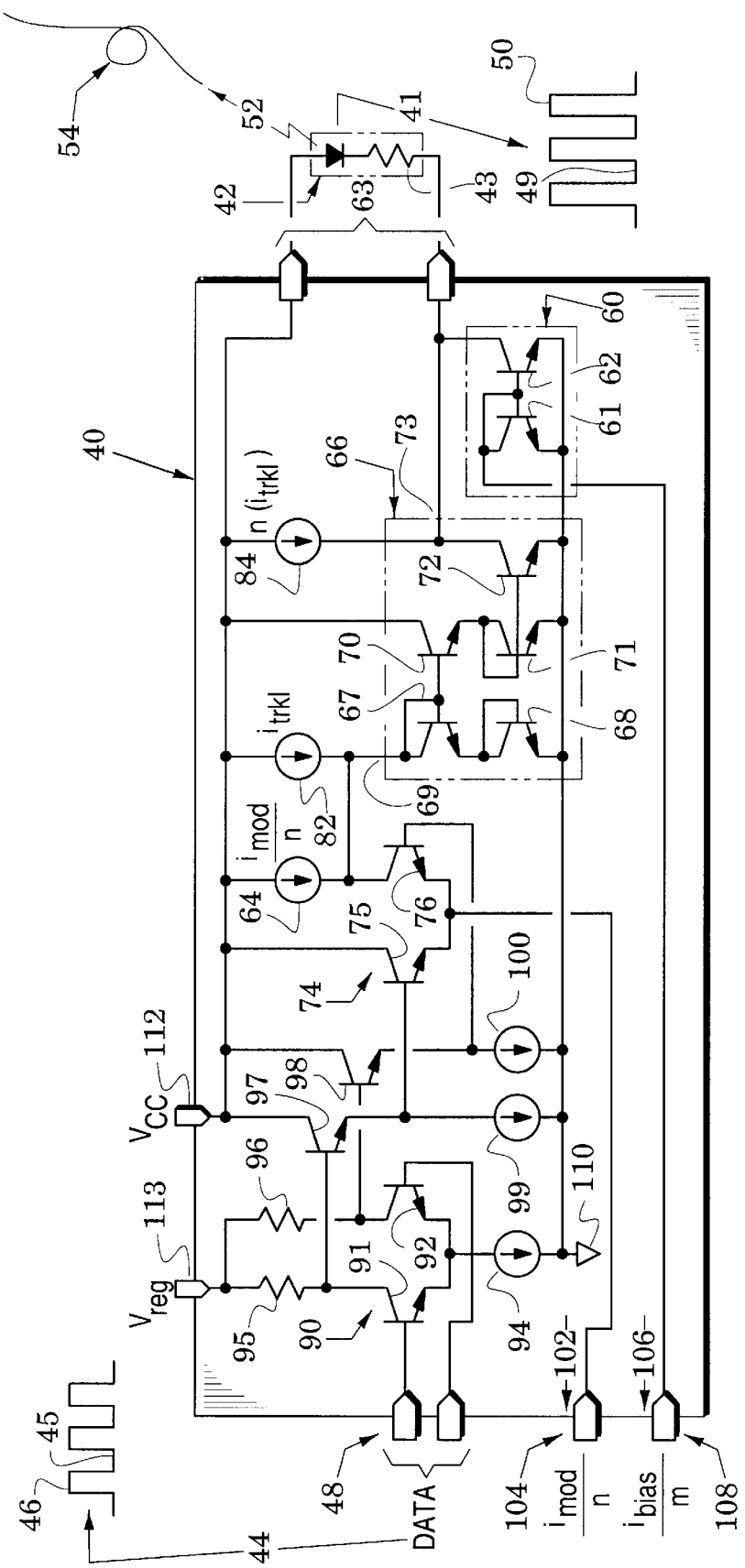
FIG. 2 is a block diagram of a laser diode data switch of the present invention.

FIG. 2 illustrates a laser-diode data switch of the invention which can be realized as a monolithic integrated-circuit chip 40 and which drives current pulses 41 through a laser diode 42 (and its parasitic resistance 43) in response to data pulses 44 at a data input port 48. The data pulses 44 are defined by first and second pulse levels 45 and 46 and the current pulses are defined by a bias current $i_{bias}$ level 49 and a modulation current $i_{mod}$ level 50 that is responsive to the data pulses. The current pulses 41 generate coherent light pulses 52 in the laser diode 42 and these light pulses are then typically transmitted through an optical fiber 54.

The structure of the data switch 40 facilitates its direct coupling to the diode laser 42 and the elimination, therefore, of coupling elements (e.g., capacitors and inductors) which would otherwise be located off chip and increase the size, complexity and cost. Because it eliminates these coupling elements, the data switch 40 eliminates settling effects of these elements and associated timing inaccuracies. Accordingly, the pulse timing of the data switch 40 is substantially unaffected by different input duty cycles. In addition to direct coupling, the structure of the data switch 40 reduces power dissipation and facilitates the use of low supply voltages (e.g., a $V_{CC}$ of 3 volts) without compromising transistor headroom. The structure of the data switch 40 thus enhances dynamic range data and facilitates high processing speeds.

In detail, the data switch 40 includes a bias current mirror 60, a modulation current source 64, a modulation current mirror 66 and a modulation differential pair 74 of transistors 75 and 76. The bias current mirror 60 is formed with a diode-coupled transistor 61 whose base is connected to the base of an output transistor 62 that is coupled to a diode output port 63 of the data switch 40.

The modulation current mirror 66 has a series-connected pair of diode-coupled transistors 67 and 68 which are driven from a mirror input port 69. The bases of the transistors 67 and 68 are respectively coupled to the bases of emitter-follower transistor 70 and diode-coupled transistor 71 which are serially connected. The emitter of the emitter-follower 70 drives an output transistor 72 which is coupled through a mirror output port 73 to the data switch's diode output port 63.

The modulation current source 64 provides an $i_{mod}/n$ current to the mirror input port 69 of the modulation current mirror 66 wherein $i_{mod}$ represents a modulation current $i_{mod}$ and n is a positive number greater than one. In addition, the mirror input port 69 is also provided with a trickle current $i_{trkl}$ from a trickle current source 82 and the mirror output port 73 is provided with a trickle-cancellation current $n(i_{trkl})$ from a trickle-cancellation current source 84.

The data switch 40 also includes a buffer differential pair 90 of transistors 91 and 92 that is coupled between a buffer current source 94 and collector resistors 95 and 96. The collectors of the transistors 91 and 92 respectively drive the bases of transistors 75 and 76 through emitter-follower transistors 97 and 98. Emitter-follower current sources 99 and 100 are respectively coupled to the emitters of the emitter-follower transistors 97 and 98.

A tail current $i_{mod}/n$ is provided (with current direction 102) through a modulation port 104 to the modulation differential pair 74 and an input current $i_{bias}/m$ is provided (with current direction 106 and wherein m is positive number greater than one) through a bias port 108 to the diode-coupled transistor 61 of the bias current mirror 60.

The bias current mirror 60 is configured to have a current gain of m and the modulation current mirror 66 is configured to have a current gain of n. These current mirror gains can be realized in various conventional ways (e.g., configuring the emitter areas of transistors 62 and 61 to have ratio of m).

In general, the elements of the data switch are arranged between a lower circuit potential (e.g., chip ground) 110 and an upper circuit potential (e.g., $V_{CC}$) 112.

In operation of the data switch 40, the bias current mirror 60 responds to the $i_{bias}/m$ input current from the bias port 108 by mirroring a bias current $i_{bias}$ through the laser diode 42. This process provides the bias current $i_{bias}$ level 49 of the laser diode's current pulses 41.

Meanwhile, the modulation current mirror 66 is connected to receive the $i_{mod}/n$ current of the modulation current source 64 at the mirror input port 69. When it does receive the $i_{mod}/n$ current, it mirrors (with its current gain n) a modulation current $i_{mod}$ through the laser diode 42. This process provides the modulation current $i_{mod}$ level 50 of the laser diode's current pulses 41. It is apparent that the laser diode's current will return to the bias current $i_{bias}$ level 49 when the modulation current mirror 66 does not receive the $i_{mod}/n$ current at the mirror input port 69.

When the $i_{mod}/n$ current is and is not received at the mirror input port 69 is determined by the modulation differential pair 74 as it responds to the data pulses 44 at the data input port 48. In response to the data pulses, the tail current $i_{mod}/n$ (from modulation port 104) will be alternately steered through transistor 75 and transistor 76 of the modulation differential pair 74.

When the tail current is steered through transistor 76, the $i_{mod}/n$ current of the current source 64 will flow through transistor 76 and will, therefore, not be provided at the mirror input port 69. When the tail current is steered through transistor 75 however, the $i_{mod}/n$ current of the current source 64 will be received at the mirror input port 69 and processed by the modulation current mirror 66 to drive the modulation current $i_{mod}$ through the laser diode 42.

In order to enhance timing accuracy and load insensitivity in the above-described current processes, the modulation differential pair 74 is preferably buffered from the input data pulses 44 and this buffering is provided by the buffer differential pair 90 and its associated emitter-follower transistors 97 and 98.

The structure of the data switch 40 provides a number of operational advantages which enable the switch to process data at a very high rate (e.g., 10 gigabits/second). Switching speed of the modulation differential pair 74, for example, is improved because the differential signal levels applied to its bases are precisely controlled by the level shifting and amplitude scaling of the buffer differential pair 90 and its associated emitter-follower transistors 97 and 98. To further enhance the accuracy of these differential signal levels, the collector resistors 95 and 96 are preferably coupled to a reference voltage $V_{ref}$ (at port 113) of a precision regulator.

Response time of the modulation current mirror 66 is enhanced because its transistors are never permitted to come out of their conduction mode. This function is realized with a trickle current $i_{trkl}$ of the trickle current source 82 that is always provided at the mirror input port 69 to maintain the transistors in an on state. Although this trickle current is configured to be very small, it will be multiplied by n at the mirror input port 73 and would introduce a slight error in the modulation current $i_{mod}$ level 50 of the laser diode's current pulses 41. This error is avoided because the mirrored trickle current at the mirror output port 73 is cancelled by the trickle-cancellation current $n(i_{trkl})$ from the trickle-cancellation current source 84.

The modulation current mirror 66 is configured so that its output transistor 72 is referenced to the ground 110 and its base is driven by the emitter follower 70. This configuration permits lowering of the chip supply voltage $V_{CC}$ to reduce chip power dissipation while still assuring ample headroom to enhance switching speed of the output transistor 72.

Consider, for example, an exemplary data switch in which $V_{CC}$ is reduced to 3 volts, the potential drop across the laser diode is 1.0 volts and the parasitic diode resistance 43 is 10 ohms. In this data switch, the modulation current mirror 66 can drive a modulation current $i_{mod}$ as high as 150 milliamps and still provide 0.5 volts of headroom for the output transistor 72. The data switch 40 can therefore be directly coupled to the laser diode 42 and does not require coupling elements (e.g., a capacitor and an inductor) which would degrade timing accuracy of the data switch.

In addition, the emitter follower 70 significantly reduces the switching currents through the diode-coupled transistors 68 and 69 with consequent improvement of switching speed. This current reduction is not required in the bias current mirror 60 because it supplies a constant current.

Chip power dissipation is reduced in the differential pair 74 and the modulation current mirror 66 because currents are further reduced by n in all transistors except the output transistor 72. Chip power dissipation is also reduced in the bias current mirror 60 because it has a gain of m which reduces the current through the diode-coupled transistor 61. In an exemplary data switch embodiment, m=n. In other data switch embodiments, m and n are greater than 5 and m and n are between 5 and 15 (e.g., 10).

Switch speed is further enhanced by coupling the bias current mirror 60 directly to the output port 63. Although the bias current could be coupled to the input port 69 of the modulation current mirror 66, this would cause the transistors of the latter mirror to increase in size which would decrease their speed. In addition, that size increase would add capacitance at the mirror output port 73 which would further decrease mirror speed.

Data switches of the invention have been described with reference to bipolar junction transistors but their structures may also be realized with other transistor types (e.g., metal oxide semiconductor (MOS) transistors). In order to fully realize their advantages, these data switches are preferably fabricated from high-speed compound semiconductors (e.g., gallium arsenide).

Figure 3:
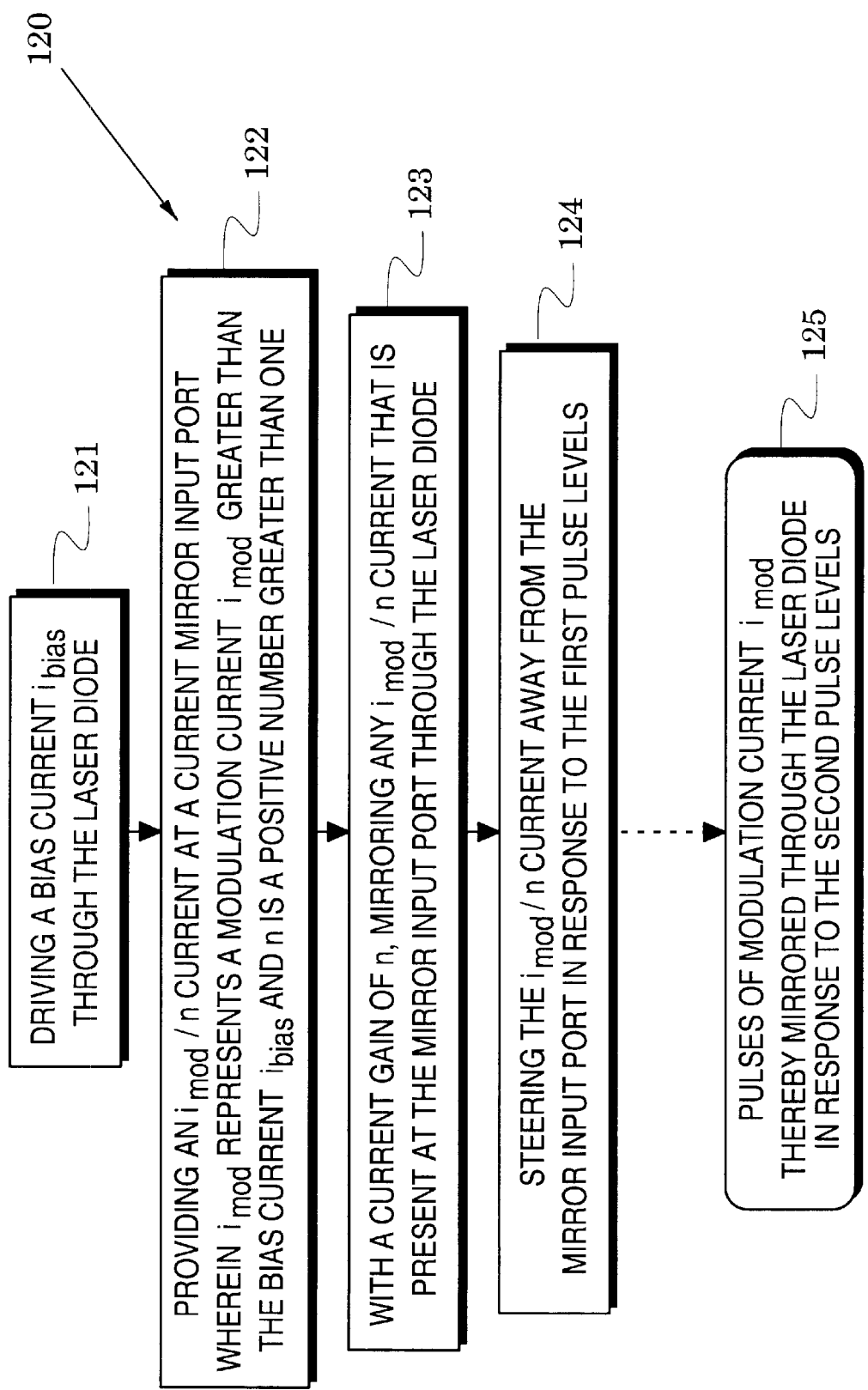
FIG. 3 is a flow diagram of process steps that can be practiced with the data switch of FIG. 2.

Functional operation of the data switch 40 is summarized in the flow chart 120 of FIG. 3. The process steps of the flow chart describe a method of driving current pulses through a laser diode to generate light pulses in response to corresponding data pulses wherein the data pulses are defined by first and second pulse levels (i.e., pulse levels 45 and 46 in FIG. 2).

In a first process step 121, a bias current $i_{bias}$ is driven through the laser diode. In a second process step 122, an $i_{mod}/n$ current is provided at a current mirror input port wherein $i_{mod}$ represents a modulation current $i_{mod}$ greater than the bias current $i_{bias}$ and n is a positive number greater than one.

With a current gain of n, any $i_{mod}/n$ current that is present at the current mirror input port is mirrored in process step 123 through the laser diode. Finally, the $i_{mod}/n$ current of process step 124 is steered away from the current mirror input port in response to the first pulse levels. Accordingly, terminator 125 summarizes that $i_{mode}$ current pulses are mirrored through the laser diode in response to the second pulse levels.

Figure 1:
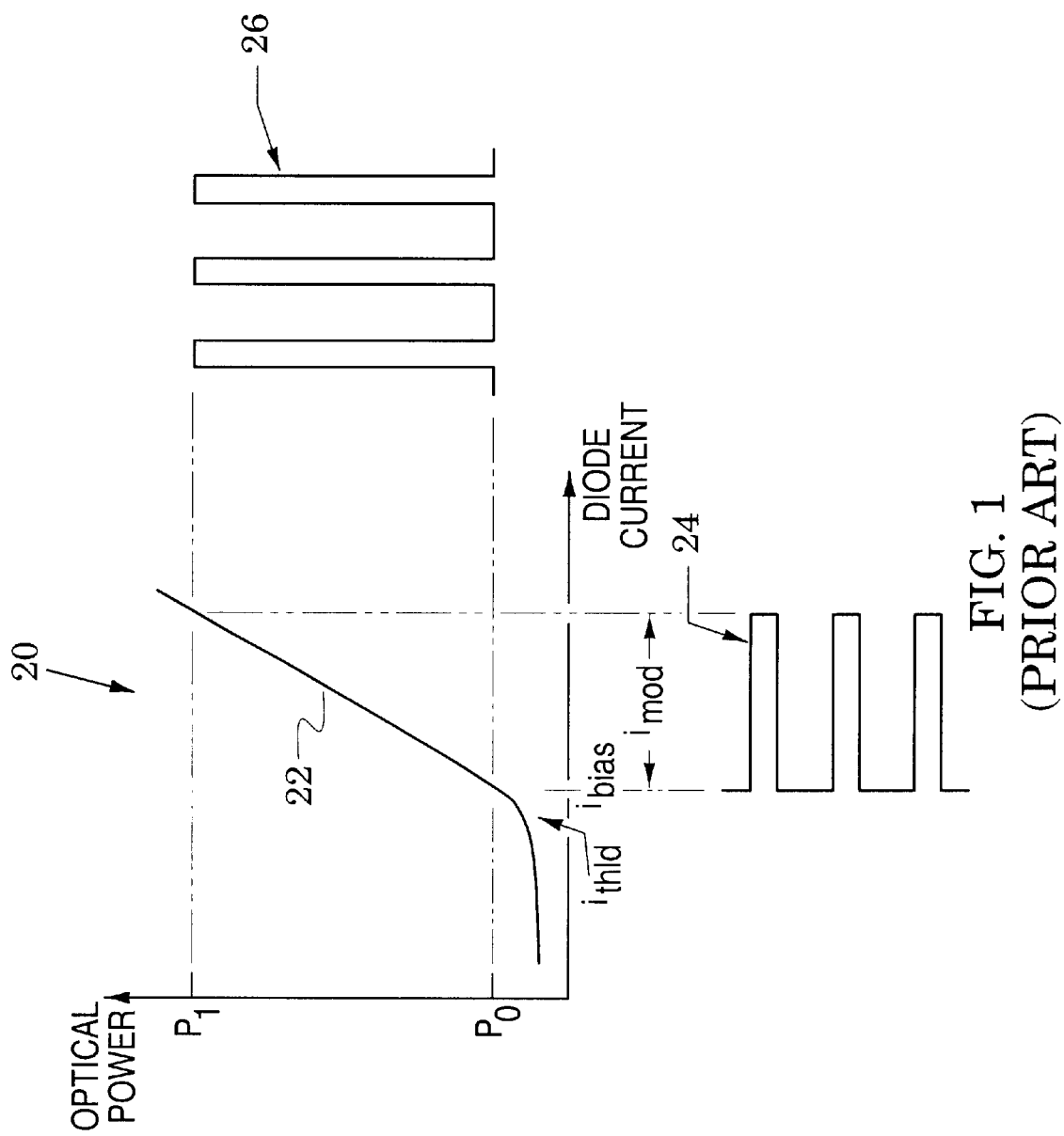
FIG. 1 is a diagram of optical power in a laser diode as a function of diode current.
Figure 4:
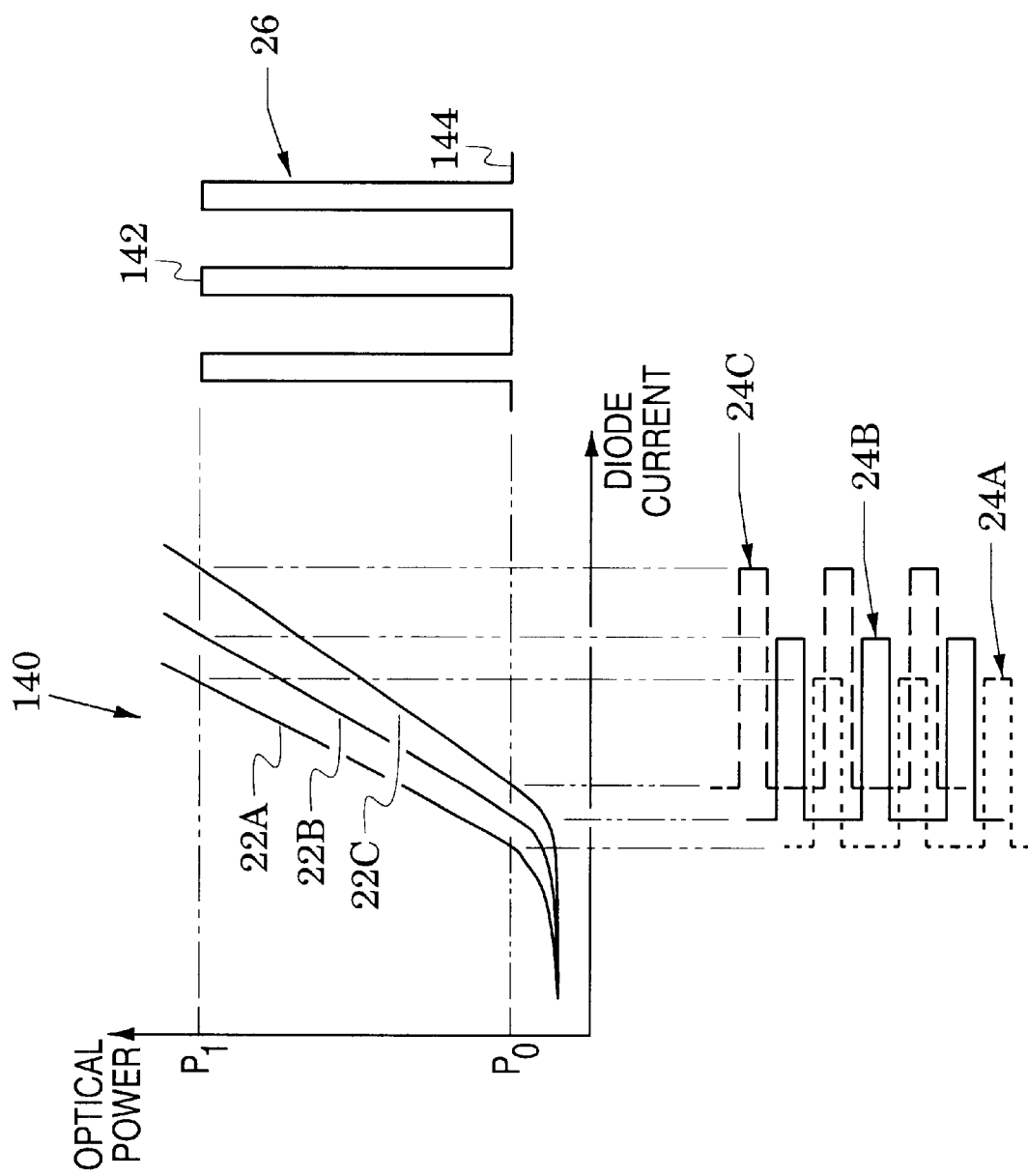
FIG. 4 is a diagram which illustrates variations in the laser diode optical power of FIG. 1.

Conceptually, the input and tail currents $i_{bias}/m$ and $i_{mod}/n$ at bias and modulation ports 108 and 104 of FIG. 2 could be supplied by on-chip current sources. The graph 140 of FIG. 4, however, shows that the optical power plot 22 of FIG. 1 typically varies, as exemplified by plots 22A, 22B and 22C, in response to various operational parameters (e.g., temperature and laser diode aging). Accordingly, the plots 22A, 22B and 22C have different threshold currents $i_{thld}$ and different slopes. In order to maintain constant current pulses 26, the plots 22A, 22B and 22C indicate that different current pulses 24A, 24B and 24C are required.

It is apparent that a constant slope but a changing threshold will have little effect on the peak-to-peak amplitude of the light pulses 26 but will change their average power. Constant threshold but a changing slope will effect both peak-to-peak amplitude and average power. The average power can thus be monitored, compared to a predetermined reference and the difference used to correct the bias current $i_{bias}$ and, accordingly, correct the average power. Similarly, the peak-to-peak power can be compared to a predetermined reference and the difference used to correct the modulation current $i_{mod}$.

Therefore, the input and tail currents $i_{bias}/m$ and $i_{mod}/n$ of the data switch 40 of FIG. 2 are preferably provided by a feedback loop which responds to the light power of the laser diode 42. Conventional feedback loops (e.g., see Zanger, Henry, et al., *Fiber Optics*, MacMillan Publishing, New York, 1991, pp. 209–210) position a light monitor (e.g., a photodiode) proximate to the laser diode to receive (e.g., from its back facet) a sample of the light energy. The feedback signal from the photodiode is compared in a controller to generate corrections to the bias current $i_{bias}$ and the modulation current $i_{mod}$.

Figure 5A:
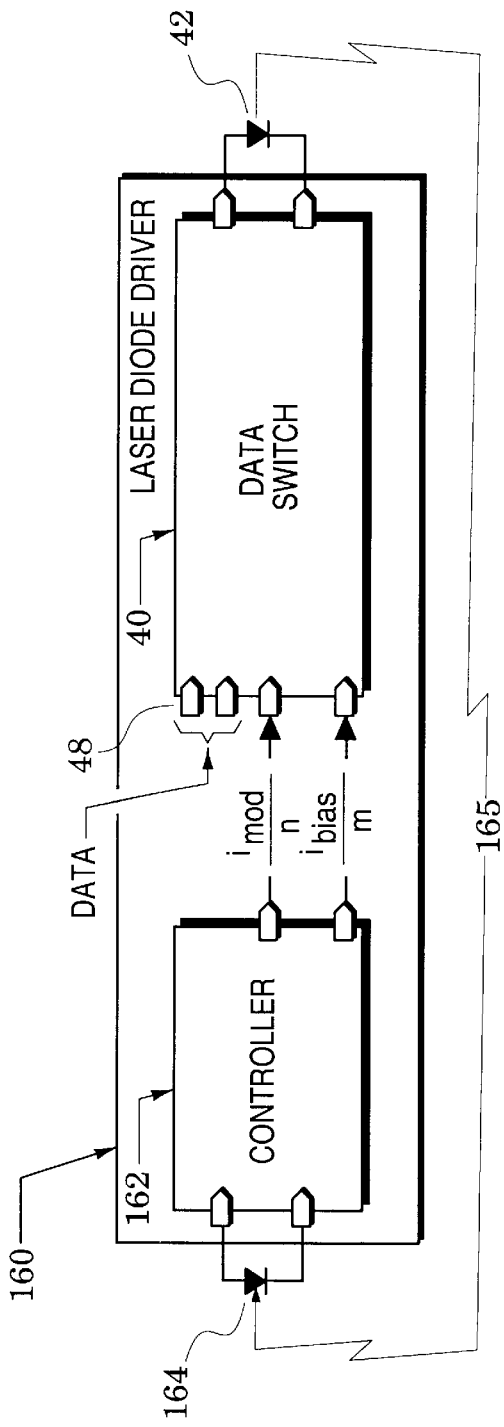
FIGS. 5A and 5B are a block diagrams of a laser diode driver that includes the data switch of FIG. 2.
Figure 5B:
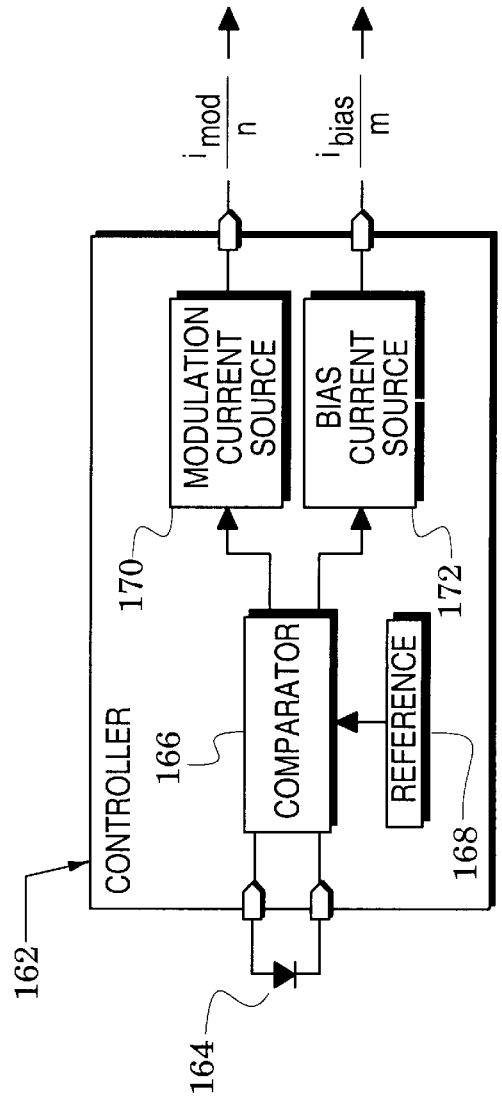

FIG. 5A shows a laser diode driver 160 which includes the data switch 40 of FIG. 2 and a controller 162. As described above, the data switch 40 drives bias and modulation currents through the laser diode 42 in response to data pulses at its data input port 48. The controller 162 has a photodiode 164 which receives feedback light 165 from the laser diode. As shown in FIG. 5B, the comparator 166 compares the output of the photodiode to at least one reference 168 to generate correction signals (e.g., signals that correspond to at least one of lower and upper power levels $P_0$ and $P_1$, peak-to-peak power and average power). The correction signals then correct modulation and bias current sources 170 and 172 which provide the $i_{bias}/m$ and $i_{mod}/n$ currents to the data switch 40.

Laser diode drivers have been described above which eliminate the need for coupling elements, reduce timing inaccuracies and power dissipation and maintain transistor headroom to thereby enhance response time and dynamic range and reduce size and cost.

Drivers of the invention realize current pulses in laser diodes in response to data pulses. In particular, the above descriptions have referred to bias current and modulation current levels (49 and 50 in FIG. 2) of laser diode current pulses and first and second pulse levels (45 and 46 in FIG. 2) of data pulses. The correspondence between these current levels and pulse levels has been recited in relative terms in the process descriptions above because the relationship is basically relative rather than absolute and it is the conceptual driver processes that define the invention. For example, the correspondence of the pulse levels 45 and 46 to the modulation current levels 49 and 50 can be interchanged by simply inverting the data signal 44 at the data input port 48.

The preferred embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A laser diode data switch that responds to data pulses and a first input current by providing modulation current pulses which can generate corresponding light pulses in a laser diode wherein said data pulses are defined by first and second pulse levels, the switch comprising:

a bias current mirror that mirrors a bias current to an output port of said bias current mirror in response to said first input current;

a modulation current source that generates a second input current;

a modulation current mirror connected to receive said second input current at a modulation current mirror input and, in response, mirror a modulation current to said output port wherein said modulation current mirror has a current gain n that is greater than one; and a modulation differential pair of transistors coupled to steer said second input current away from said modulation current mirror input in response to said first pulse levels;

said modulation current pulses thereby mirrored to said output port during said second pulse levels.

2. The switch of claim 1, wherein n is greater than 5.

3. The switch of claim 1, wherein n is between 5 and 15.

4. The switch of claim 1, further including:

a trickle current source that provides a trickle current to said modulation current mirror wherein said trickle current is substantially less than said second input current; and a trickle-cancellation current source that provides a trickle-cancellation current to said output port to thereby cancel a corresponding output current from said modulation current mirror.

5. The switch of claim 1, wherein said modulation current mirror includes:

a pair of diode-coupled transistors coupled to receive said second input current;

an output transistor that provides said modulation current; and an emitter-follower transistor coupled to drive said output transistor in response to said diode-coupled transistors.

6. The switch of claim 1, wherein said bias current mirror has a current gain of m wherein m is a positive number greater than one.

7. The switch of claim 6, wherein m is between 5 and 15.

8. The switch of claim 1, further including a buffer differential pair of transistors wherein said buffer differential pair is inserted to drive said modulation differential pair in response to said data pulses.

9. The switch of claim 1, wherein said bias current source, said modulation current source and said modulation differential pair are realized with bipolar junction transistors.

10. A method of providing modulation current pulses in response to corresponding data pulses wherein said data pulses are defined by first and second pulse levels and wherein said current pulses can generate corresponding light pulses in a laser diode, the method comprising the steps of:

in response to a first input current, mirroring a bias current to an output port;

providing a second input current at a current mirror input port;

with a current mirror gain n that is greater than one and in response to said second input current at said current mirror input port, mirroring a modulation current to said output port; and steering said second input current away from said input port in response to said first pulse levels;

said modulation current pulses thereby mirrored to said output port during said second pulse levels.

11. The method of claim 10, wherein n is greater than 5.

12. The method of claim 10, wherein n is between 5 and 15.

13. A laser diode driver that responds to data pulses by providing modulation current pulses which can generate corresponding light pulses in a laser diode wherein said data pulses are defined by first and second pulse levels, the driver comprising:

a bias current mirror that mirrors a bias current to an output port of said bias current mirror in response to a first input current;

a modulation current source that generates a second input current;

a modulation current mirror connected to receive said second input current at a modulation current mirror input and, in response, mirror a modulation current to said output port wherein said modulation current mirror has a current gain n that is greater than one;

a modulation differential pair of transistors coupled to steer said second input current away from said modulation current mirror input in response to a tail current and said first pulse levels; and a controller that has a light monitor that responds to light and wherein said controller is configured to supply said first input and tail currents respectively to said bias current mirror and said modulation differential pair in response to said light monitor;

said modulation current mirror pulses thereby mirrored to said output port during said second pulse levels.

14. The driver of claim 13, wherein n is greater than 5.

15. The driver of claim 13, wherein n is between 5 and 15.

16. The driver of claim 13, further including:

a trickle current source that provides a trickle current to said modulation current mirror wherein said trickle current is substantially less than said second input current; and a trickle-cancellation current source that provides a trickle-cancellation current to said output port to thereby cancel a corresponding output current from said modulation current mirror.

17. The driver of claim 13, wherein said modulation current mirror includes:

a pair of diode-coupled transistors coupled to receive said second input current;

an output transistor that provides said modulation current; and an emitter-follower transistor coupled to drive said output transistor in response to said diode-coupled transistors.

18. The driver of claim 13, wherein said light monitor is a photodiode and said controller includes:

a comparator that generates correction signals in response to differences between said photodiode and at least one reference signal;

a bias current source that responds to at least one of said correction signals and provides a corresponding input current to said bias current mirror; and a modulation current source that responds to at least one of said correction signals and provides a corresponding tail current to said modulation differential pair.

19. The driver of claim 13, wherein said bias current mirror has a current gain of m wherein m is a positive number greater than one.

20. The driver of claim 13, further including a buffer differential pair of transistors wherein said buffer differential pair is inserted to drive said modulation differential pair in response to said data pulses.

21. A laser diode data switch that responds to data pulses by providing modulation current pulses which can generate corresponding light pulses in a laser diode wherein said data pulses are defined by first and second pulse levels, the switch comprising:

a bias current mirror that receives a first input current and, in response, mirrors a bias current to an output port of said bias current mirror;

a modulation current mirror that receives a second input current at a modulation current mirror input and, in response, mirrors a modulation current to said output port; and a modulation differential pair of transistors coupled to steer said second input current away from said modulation current mirror input in response to said first pulse levels;

said modulation current pulses thereby mirrored to said output port during said second pulse levels.

22. The switch of claim 21, further including a modulation current source that provides said second input current.

23. The switch of claim 21, wherein said transistors of said modulation differential pair have control terminals coupled to receive said data pulses and one of said transistors has a current terminal coupled to said modulation current mirror input to receive said second input current.

24. The switch of claim 21, further including:

a trickle current source that provides a trickle current to said modulation current mirror wherein said trickle current is substantially less than said second input current; and a trickle-cancellation current source that provides a trickle-cancellation current to said output port to thereby cancel a corresponding output current from said modulation current mirror.

25. The switch of claim 21, wherein said bias current mirror includes:

at least one diode-coupled transistor that receives said first input current; and an output transistor coupled between said diode-coupled transistor and said output port to mirror said first input current into said bias current.

26. The switch of claim 21, wherein said modulation current mirror includes:

a pair of diode-coupled transistors coupled to receive said second input current;

an output transistor that provides said modulation current; and an emitter-follower transistor coupled to drive said output transistor in response to said diode-coupled transistors.

27. The switch of claim 21, further including a buffer differential pair of transistors inserted to receive said data pulses and, in response, drive said modulation differential pair.

28. The switch of claim 21, wherein said bias current mirror, said modulation current mirror and said modulation differential pair are realized with bipolar junction transistors.

* * * * *